United States Patent
Kawada et al.

(10) Patent No.: US 7,211,533 B2
(45) Date of Patent: May 1, 2007

(54) OXIDE PORCELAIN COMPOSITION, CERAMIC MULTILAYER SUBSTRATE, AND CERAMIC ELECTRONIC COMPONENT

(75) Inventors: Yuzo Kawada, Higashiomi (JP); Nobuyuki Sakai, Kyoto (JP); Yutaka Fukuda, Takefu (JP); Takayuki Tsukizawa, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 75 days.

(21) Appl. No.: 11/116,200

(22) Filed: Apr. 28, 2005

(65) Prior Publication Data

US 2006/0246322 A1 Nov. 2, 2006

(51) Int. Cl.
- *C04B 35/19* (2006.01)
- *B32B 15/04* (2006.01)
- *B32B 9/00* (2006.01)
- *B32B 19/00* (2006.01)

(52) U.S. Cl. .................. 501/128; 428/209; 428/210; 428/701; 428/702

(58) Field of Classification Search ............... 501/128; 428/209, 210, 701, 702
See application file for complete search history.

(56) References Cited

U.S. PATENT DOCUMENTS

| | | | | |
|---|---|---|---|---|
| 4,783,431 | A | * | 11/1988 | Hoshi et al. ................ 501/153 |
| 6,379,805 | B1 | * | 4/2002 | Oobuchi et al. ............ 428/446 |
| 6,764,746 | B2 | * | 7/2004 | Oobuchi et al. ............ 428/209 |

FOREIGN PATENT DOCUMENTS

| | | |
|---|---|---|
| JP | 04-016551 | 1/1992 |
| JP | 2001-206763 | 7/2001 |
| JP | 2004-146635 | 5/2004 |

* cited by examiner

*Primary Examiner*—Karl Group
(74) *Attorney, Agent, or Firm*—Dickstein Shapiro LLP

(57) ABSTRACT

An oxide porcelain composition includes at least one metal element selected from Al, Si, Ba, B and Cr. The oxide porcelain composition contains about 11.5 weight percent to 60.0 weight percent of Al, in the form of $Al_2O_3$; about 4.0 weight percent to 70.0 weight percent of Si, in the form of $SiO_2$; about 4.0 weight percent to 40.0 weight percent of Ba, in the form of BaO; about 1.0 weight percent to 30.0 weight percent of B, in the form of $B_2O_3$; and about 0.3 weight percent to 3.0 weight percent of Cr, in the form of $Cr_2O_3$.

19 Claims, 2 Drawing Sheets

OXIDE PORCELAIN COMPOSITION, CERAMIC MULTILAYER SUBSTRATE, AND CERAMIC ELECTRONIC COMPONENT

BACKGROUND OF THE INVENTION

1. Field of the Invention

The present invention relates to an insulative oxide porcelain composition used for, for example, ceramic multilayer substrates and ceramic electronic components.

2. Description of the Related Art

Hitherto, an oxide porcelain composition composed of $BaO$—$Al_2O_3$—$SiO_2$ is known as an insulative material used for ceramic multilayer substrates and ceramic electronic components. For instance, Japanese Unexamined Patent Application Publication No. 4-16551 discloses a porcelain composition containing oxides of Si, Ba, Al, B, Cr and Ca. This oxide porcelain composition can be fired at a low temperature and over a wide temperature range. Furthermore, this oxide porcelain composition has a high insulation resistance and a small relative dielectric constant.

Meanwhile, electrical circuit devices including those containing a ceramic multilayer substrate or a ceramic electronic component are being reduced in size. Accordingly, reducing the size and the layer thickness of ceramic multilayer substrates and ceramic electronic components is desired. Therefore, an oxide porcelain composition having a flexural strength that can meet size-reduction requirements is desired.

In general, the flexural strength of a ceramic significantly depends on its composition. A substrate composed of the porcelain composition disclosed in the above patent application has a flexural strength of less than 200 MPa. As a result, cracks may be generated when such a substrate is mounted on an electrical circuit device. Thus, the known porcelain composition cannot satisfactorily meet the market's requirements.

SUMMARY OF THE INVENTION

Accordingly, it is an object of the present invention to provide an oxide porcelain composition composed of $BaO$—$Al_2O_3$—$SiO_2$ of which the flexural strength of a multilayer substrate or an electronic component using the porcelain composition can be improved. As a result, the reliability of a multilayer substrate and an electronic component whose size and thickness have been reduced can be improved. Also, it is an object of the present invention to provide a ceramic multilayer substrate and a ceramic electronic component using the oxide porcelain composition.

In order to accomplish the above object, an oxide porcelain composition of the present invention includes Al, Si, Ba, B and Cr as metal elements. The oxide porcelain composition contains about 11.5 weight percent to 60.0 weight percent of Al, in the form of $Al_2O_3$; about 4.0 weight percent to 70.0 weight percent of Si, in the form of $SiO_2$; about 4.0 weight percent to 40.0 weight percent of Ba, in the form of BaO; about 1.0 weight percent to 30.0 weight percent of B, in the form of $B_2O_3$; and about 0.3 weight percent to 3.0 weight percent of Cr, in the form of $Cr_2O_3$.

According to the present invention, an oxide porcelain composition includes 100 parts by weight of the above oxide porcelain composition serving as a main component; and about 3 parts by weight or less of at least one oxide serving as an additional component selected from CaO, MgO, ZnO, and SrO.

A ceramic multilayer substrate of the present invention includes a ceramic laminated body including ceramic layers, and inner conductors disposed between the ceramic layers, wherein the ceramic layers include the above oxide porcelain composition.

A ceramic electronic component of the present invention includes a ceramic body, inner conductors disposed inside the ceramic body, and outer electrodes disposed on the surface of the ceramic body, wherein the ceramic body includes the above oxide porcelain composition.

In the ceramic electronic component of the present invention, the main component of the inner conductors and the outer electrodes is copper.

According to the present invention, the flexural strength of a multilayer circuit board or an electronic component using an oxide porcelain composition composed of $BaO$—$Al_2O_3$—$SiO_2$ can be improved.

In addition, a Q factor of at least 1,000 and an excellent solderability can be provided. As a result, the oxide porcelain composition of the present invention can improve the reliability of a multilayer circuit board and an electronic component whose size and thickness have been reduced. Furthermore, the temperature range in which the porcelain composition can be fired is widened. Consequently, the generation of defective products due to temperature fluctuation or temperature variation in a firing furnace can be suppressed to improve the yield.

DESCRIPTION OF THE PREFERRED EMBODIMENTS

EXAMPLE 1

Figure 1:
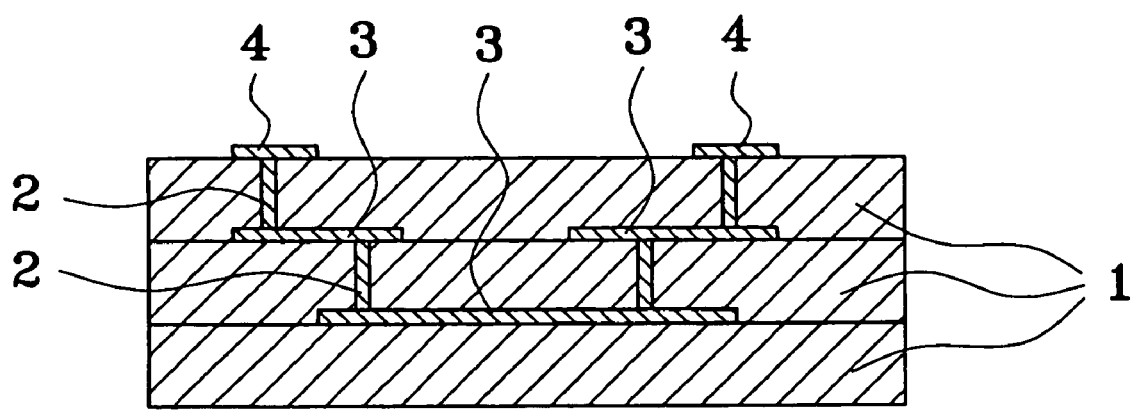
FIG. 1 is a cross-sectional view showing an embodiment of a ceramic multilayer substrate of the present invention.

Firstly, $SiO_2$, $BaCO_3$, $Al_2O_3$, $B_2O_3$ and $Cr_2O_3$ powders, all of which had a particle diameter of 2.0 μm or less, were prepared as starting materials.

These powders were weighed and mixed so as to obtain oxide porcelain compositions having the composition ratios shown in Table 1. Each of the mixed powders was calcinated at 800° C. to 1,000° C. The resultant calcinated product was pulverized with a zirconia ball mill for 12 hours to prepare a base powder.

Polyvinyl butyral serving as an organic binder, dioctyl phthalate (DOP) serving as a plasticizer, and a solvent mainly containing toluene were added to the base powder. The mixture was mixed with a ball mill. Subsequently, the mixture was deaerated under reduced pressure to prepare slurry. For example, the time for pulverizing the base powder is preferably controlled so that the powder in the slurry has an average particle diameter of about 1.5 μm or less. When the average particle diameter of the powder in the slurry is about 1.5 μm or less, the firing temperature can be decreased.

The resultant slurry was formed into a film by the doctor blade method to prepare a green sheet having a thickness of 1 mm. Subsequently, the film was recovered and the green sheet was cut so as to have a predetermined shape. The resultant green sheet was fired at 950° C. to 1,040° C. in a non-oxidizing atmosphere containing nitrogen and hydrogen. Thus, a sheet-shaped porcelain sample was prepared.

Subsequently, paste composed of a copper power and an organic vehicle (80:20 by weight) was prepared. The paste, serving as an electrode precursor, was printed on the surface and the reverse face of the porcelain sample. The sample was then fired at 950° C. to 1,040° C. in a non-oxidizing atmosphere containing nitrogen and hydrogen. Thus, a sample having copper electrodes was prepared.

Subsequently, the flexural strength of the sample was measured by a three-point flexure test according to Japanese Industrial Standard (JIS) R1601.

In addition, regarding the electrical characteristics, the electrostatic capacitance and Q factor at a frequency of 1 MHz, and the insulation resistance at DC 100V were measured. The relative dielectric constant ($\epsilon r$) was calculated from the electrostatic capacitance.

Furthermore, the solderability of the sample was evaluated as follows: The sample was heated for 20 seconds and then a flux containing chlorine was applied on the surface of the copper electrode. The sample was then immersed in a soldering bath at 230° C. (Sn/Pb=6/4 by weight) for 5 seconds to perform the soldering. The surface of the copper electrode was visually inspected. When at least 90% of the surface of the copper electrode was covered with the solder, the solderability was determined to be satisfactory. When less than 90% of the surface of the copper electrode was covered with the solder, the solderability was determined to be unsatisfactory.

Table 1 shows the results. In the solderability column in Table 1, the symbol "○" means that the solderability was satisfactory, whereas the symbol "x" means that the solderability was unsatisfactory. In Table 1, sample numbers having the symbol * mean that the samples are not in the range of the present invention. All other samples are in the range of the present invention.

TABLE 1

| Sample | Composition (weight %) | | | | | Dielectric characteristics (1 MHz) | | Flexural strength (MPa) | Solderability |
|---|---|---|---|---|---|---|---|---|---|
| | $Al_2O_3$ | $SiO_2$ | BaO | $B_2O_3$ | $Cr_2O_3$ | $\epsilon r$ | Q | | |
| *1  | 7.0  | 60.0 | 29.5 | 2.0  | 1.5 | 5.9 | 1600 | 170 | ○ |
| *2  | 10.0 | 58.0 | 28.0 | 3.0  | 1.0 | 6.0 | 1800 | 180 | ○ |
| 3   | 11.5 | 55.5 | 28.0 | 3.0  | 2.0 | 6.1 | 1600 | 210 | ○ |
| *4  | 11.5 | 60.0 | 26.0 | 0.5  | 2.0 | 5.5 | 950  | 200 | ○ |
| 5   | 12.0 | 60.0 | 26.0 | 1.0  | 1.0 | 6.0 | 1100 | 220 | ○ |
| *6  | 12.0 | 72.0 | 2.0  | 11.0 | 3.0 | 4.9 | 850  | 210 | ○ |
| 7   | 13.0 | 62.0 | 16.0 | 7.0  | 2.0 | 5.7 | 1750 | 250 | ○ |
| 8   | 14.0 | 54.0 | 28.0 | 3.0  | 1.0 | 6.3 | 2000 | 260 | ○ |
| 9   | 14.0 | 70.0 | 4.0  | 10.0 | 2.0 | 5.2 | 1200 | 210 | ○ |
| *10 | 16.0 | 32.0 | 45.0 | 6.0  | 1.0 | 7.4 | 900  | 250 | ○ |
| 11  | 16.0 | 36.0 | 40.0 | 7.0  | 1.0 | 7.1 | 1300 | 255 | ○ |
| 12  | 17.0 | 42.0 | 32.0 | 6.0  | 3.0 | 6.8 | 1600 | 250 | ○ |
| *13 | 18.0 | 42.0 | 30.0 | 5.0  | 5.0 | 6.8 | 1750 | 245 | X |
| 14  | 18.0 | 44.0 | 31.7 | 6.0  | 0.3 | 8.2 | 1550 | 240 | ○ |
| *15 | 18.0 | 44.0 | 32.0 | 6.0  | 0.1 | 6.8 | 1500 | 240 | X |
| 16  | 23.0 | 48.0 | 15.0 | 11.0 | 3.0 | 6.4 | 1500 | 220 | ○ |
| 17  | 25.0 | 43.0 | 18.0 | 12.0 | 2.0 | 6.7 | 1400 | 220 | ○ |
| 18  | 28.0 | 39.0 | 25.0 | 7.0  | 1.0 | 7.1 | 2100 | 245 | ○ |
| 19  | 30.0 | 53.0 | 6.0  | 10.0 | 1.0 | 6.3 | 1100 | 230 | ○ |
| 20  | 40.0 | 10.0 | 38.0 | 14.0 | 1.0 | 9.1 | 1700 | 230 | ○ |
| 21  | 44.0 | 18.0 | 25.0 | 12.0 | 1.0 | 8.4 | 1800 | 240 | ○ |
| *22 | 45.0 | 37.0 | 0    | 17.0 | 1.0 | 7.3 | 800  | 210 | ○ |
| 23  | 49.0 | 11.0 | 21.0 | 18.0 | 1.0 | 8.9 | 1400 | 220 | ○ |
| 24  | 51.0 | 4.0  | 23.0 | 20.0 | 2.0 | 9.3 | 1200 | 210 | ○ |
| 25  | 52.0 | 25.0 | 9.0  | 13.0 | 1.0 | 8.1 | 1600 | 240 | ○ |
| 26  | 55.0 | 8.0  | 6.0  | 30.0 | 1.0 | 9.2 | 1000 | 200 | ○ |
| *27 | 56.0 | 5.0  | 4.0  | 34.0 | 1.0 | 9.5 | 500  | 200 | ○ |
| *28 | 60.0 | 2.0  | 13.0 | 22.0 | 3.0 | 9.6 | 900  | 230 | ○ |
| 29  | 60.0 | 13.5 | 5.0  | 20.0 | 1.5 | 8.9 | 1000 | 205 | ○ |
| *30 | 70.0 | 5.0  | 5.0  | 18.0 | 2.0 | 9.6 | 800  | 175 | ○ |

Oxide porcelain compositions in the range of the present invention contain about 11.5 weight percent to 60.0 weight percent of Al, in the form of $Al_2O_3$; about 4.0 weight percent to 70.0 weight percent of Si, in the form of $SiO_2$; about 4.0 weight percent to 40.0 weight percent of Ba, in the form of BaO; about 1.0 weight percent to 30.0 weight percent of B, in the form of $B_2O_3$; and about 0.3 weight percent to 3.0 weight percent of Cr, in the form of $Cr_2O_3$. As is apparent from Table 1, the oxide porcelain compositions of the present invention had an excellent flexural strength of at least 200 MPa. Furthermore, the oxide porcelain compositions of the present invention showed a Q factor of at least 1,000 and were excellent in solderability.

In contrast, as shown in Samples 1 and 2, when the $Al_2O_3$ content was less than about 11.5 weight percent, or as shown in Sample 30, when the $Al_2O_3$ content exceeded about 60.0 weight percent, the flexural strength was low, i.e., less than 200 MPa.

The change in the flexural strength depending on the $Al_2O_3$ content results from the precipitation of an aluminum compound. When the $Al_2O_3$ content was less than about 11.5 weight percent, the aluminum compound was not sufficiently precipitated. As a result, the flexural strength was low, i.e., less than 200 MPa. On the other hand, when the $Al_2O_3$ content exceeded about 60.0 weight percent, the firing property was deteriorated. Consequently, the density of the fired porcelain product was not sufficiently increased. Therefore, the flexural strength was decreased to less than 200 MPa.

Samples 28 and 6 show that when the $SiO_2$ content was less than about 4.0 weight percent or exceeded about 70.0 weight percent, the firing property was deteriorated. Consequently, it was difficult to increase the density of the fired product sufficiently. Therefore, the Q factor was less than 1,000.

As shown in Samples 22 and 10, when the BaO content was less than about 4.0 weight percent or exceeded about 40.0 weight percent, the firing property was deteriorated. Consequently, it was difficult to increase the density of the fired product sufficiently. Therefore, the Q factor was less than 1,000.

Sample 4 shows that when the $B_2O_3$ content was less than about 1.0 weight percent, the firing property was deteriorated. Consequently, it was difficult to increase the density of the fired product sufficiently. Therefore, the Q factor was less than 1,000. On the other hand, when the $B_2O_3$ content exceeded about 30.0 weight percent, an amorphous phase was increased. As a result, the Q factor was less than 1,000.

As shown in Samples 15 and 13, when the $Cr_2O_3$ content was less than about 0.3 weight percent or exceeded about 3.0 weight percent, the solderability was somewhat deteriorated. A glass phase appearing on the surface of the electrode during the firing deteriorates the solderability. Chromium has an advantage of preventing the glass phase from flowing, and the deterioration of the solderability can thus be prevented.

EXAMPLE 2

The same $SiO_2$, $BaCO_3$, $Al_2O_3$, $B_2O_3$ and $Cr_2O_3$ powders as those in Example 1 were prepared as starting materials. In addition, $CaCO_3$, $Mg(OH)_2$, ZnO and $SrCO_3$ powders, all of which had a particle diameter of 2.0 µm or less, were prepared.

Subsequently, porcelain samples having the composition ratios shown in Table 2 were prepared as in Example 1. In the firing step, the firing temperature was varied using samples having the same composition. Thus, the temperature range over which the porcelain composition could be fired, i.e., the firing temperature range, was evaluated.

In general, the firing shrinkage ratio during ceramic firing changes as follows: As the firing temperature increases up to a certain temperature, the firing shrinkage ratio also increases and at a certain temperature, the firing shrinkage ratio reaches a maximum. As the firing temperature further increases, the firing shrinkage ratio decreases. In the present invention, the temperature at which the maximum firing shrinkage ratio is provided was defined as an optimum firing temperature. In addition, a temperature range in which the difference from the maximum shrinkage ratio is within 0.5% was defined as the firing temperature range. The firing temperature range was used as a parameter showing the ease of firing.

Table 2 shows the above results. In Table 2, sample numbers having the symbol ⊙ mean that the samples are in a more preferable range of the present invention. Other samples are also in the range of the present invention but are not in the more preferable range of the present invention.

TABLE 2

| Sample | Main component (weight %) | | | | | Additional component (parts by weight) | | | | Firing temperature range(° C.) | |
|---|---|---|---|---|---|---|---|---|---|---|---|
| | $Al_2O_3$ | $SiO_2$ | BaO | $B_2O_3$ | $Cr_2O_3$ | CaO | MgO | ZnO | SrO | Temperature range | Temperature width |
| 31 | 12.0 | 54.0 | 30.0 | 3.0 | 1.0 | 0 | 0 | 0 | 0 | 976 To 990 | 14 |
| ⊙'32 | 12.0 | 54.0 | 30.0 | 3.0 | 1.0 | 1 | 0 | 0 | 0 | 966 To 988 | 22 |
| ⊙'33 | 12.0 | 54.0 | 30.0 | 3.0 | 1.0 | 2 | 0 | 0 | 0 | 970 To 996 | 26 |
| ⊙'34 | 12.0 | 54.0 | 30.0 | 3.0 | 1.0 | 3 | 0 | 0 | 0 | 976 To 998 | 22 |
| 35 | 12.0 | 54.0 | 30.0 | 3.0 | 1.0 | 5 | 0 | 0 | 0 | 998 To 1014 | 16 |
| ⊙'36 | 12.0 | 54.0 | 30.0 | 3.0 | 1.0 | 0 | 1 | 0 | 0 | 968 To 988 | 20 |
| ⊙'37 | 12.0 | 54.0 | 30.0 | 3.0 | 1.0 | 0 | 0 | 1 | 0 | 972 To 994 | 22 |
| ⊙'38 | 12.0 | 54.0 | 30.0 | 3.0 | 1.0 | 0 | 0 | 0 | 1 | 972 To 992 | 20 |
| ⊙'39 | 12.0 | 54.0 | 30.0 | 3.0 | 1.0 | 1 | 1 | 0 | 0 | 970 To 994 | 24 |
| ⊙'40 | 12.0 | 54.0 | 30.0 | 3.0 | 1.0 | 1 | 1 | 1 | 0 | 980 To 998 | 18 |
| 41 | 12.0 | 54.0 | 30.0 | 3.0 | 1.0 | 2 | 1 | 1 | 1 | 1004 To 1020 | 16 |

As is apparent from Table 2, when a porcelain composition contained a total amount of about three parts by weight or less of at least one oxide serving as an additional component selected from CaO, MgO, ZnO and SrO, the firing temperature range was increased. As a result, the porcelain composition could be fired easily. In contrast, as shown in Samples 35 and 41, when the porcelain composition contained a total of more than about three parts by weight of at least one oxide selected from CaO, MgO, ZnO and SrO, the firing temperature was increased to about 1,000° C. Furthermore, the width of the firing temperature range was almost the same as that of Sample 31, which did not contain the above oxides.

EXAMPLE 3

The same starting materials as those in Example 1 were prepared. Subsequently, as in Example 1, the powders were weighed and mixed so as to obtain the porcelain composition having the composition ratio of Sample 8 in Table 1, a slurry was prepared, and a green sheet was then prepared.

Subsequently, the green sheet was cut so as to have a predetermined shape. A conductive pattern mainly composed of copper (Cu) was printed on the surfaces of a plurality of resultant green sheets by screen printing. Via holes were formed on the plurality of green sheets having the conductive pattern using a puncher. A conductor mainly composed of Cu was filled in the via holes. The green sheets were laminated such that the conductive patterns disposed on the surface of each green sheet were electrically connected to each other, and were compression bonded. The resultant green sheets were fired at 980° C. in a non-oxidizing atmosphere containing nitrogen and hydrogen.

Thus, a ceramic multilayer substrate shown in FIG. 1 was prepared. The ceramic multilayer substrate included ceramic layers 1, inner conductors 3 that were electrically connected to each other by means of via holes 2, and outer conductors (electrodes) 4.

Subsequently, the flexural strength of the ceramic multilayer substrate was measured as in Example 1. The ceramic multilayer substrate had an excellent flexural strength of 200 MPa or more.

EXAMPLE 4

Figure 2:
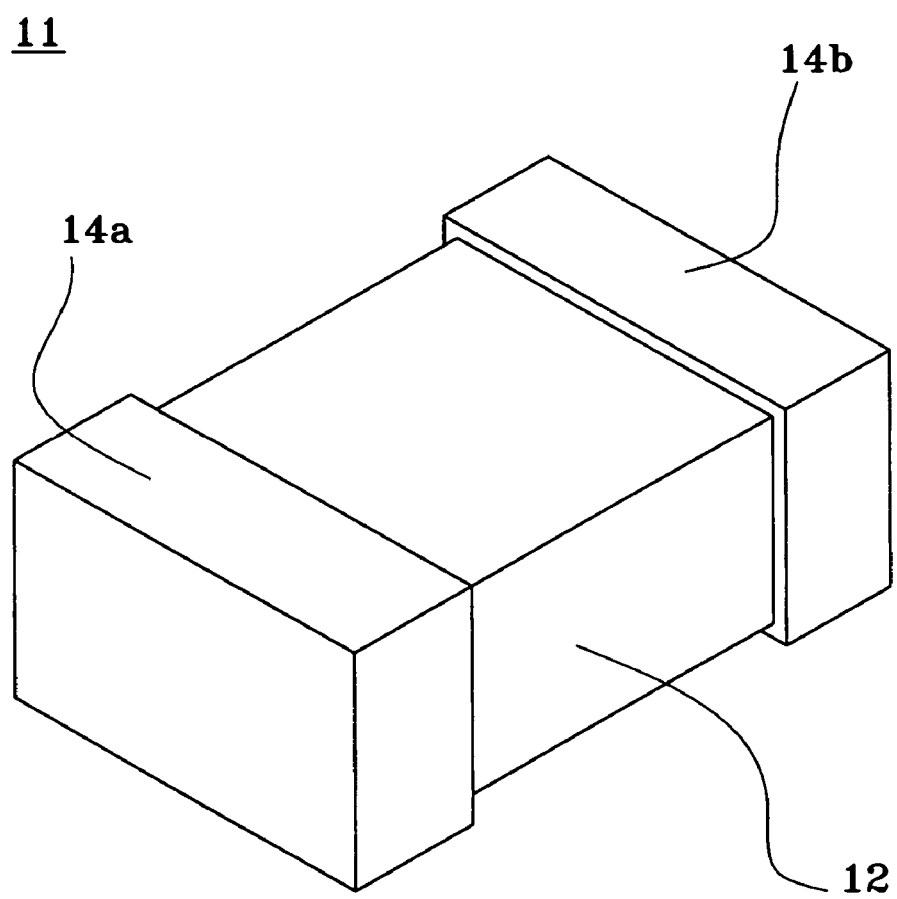
FIG. 2 is a perspective view showing an embodiment of a ceramic electronic component of the present invention.
Figure 3:
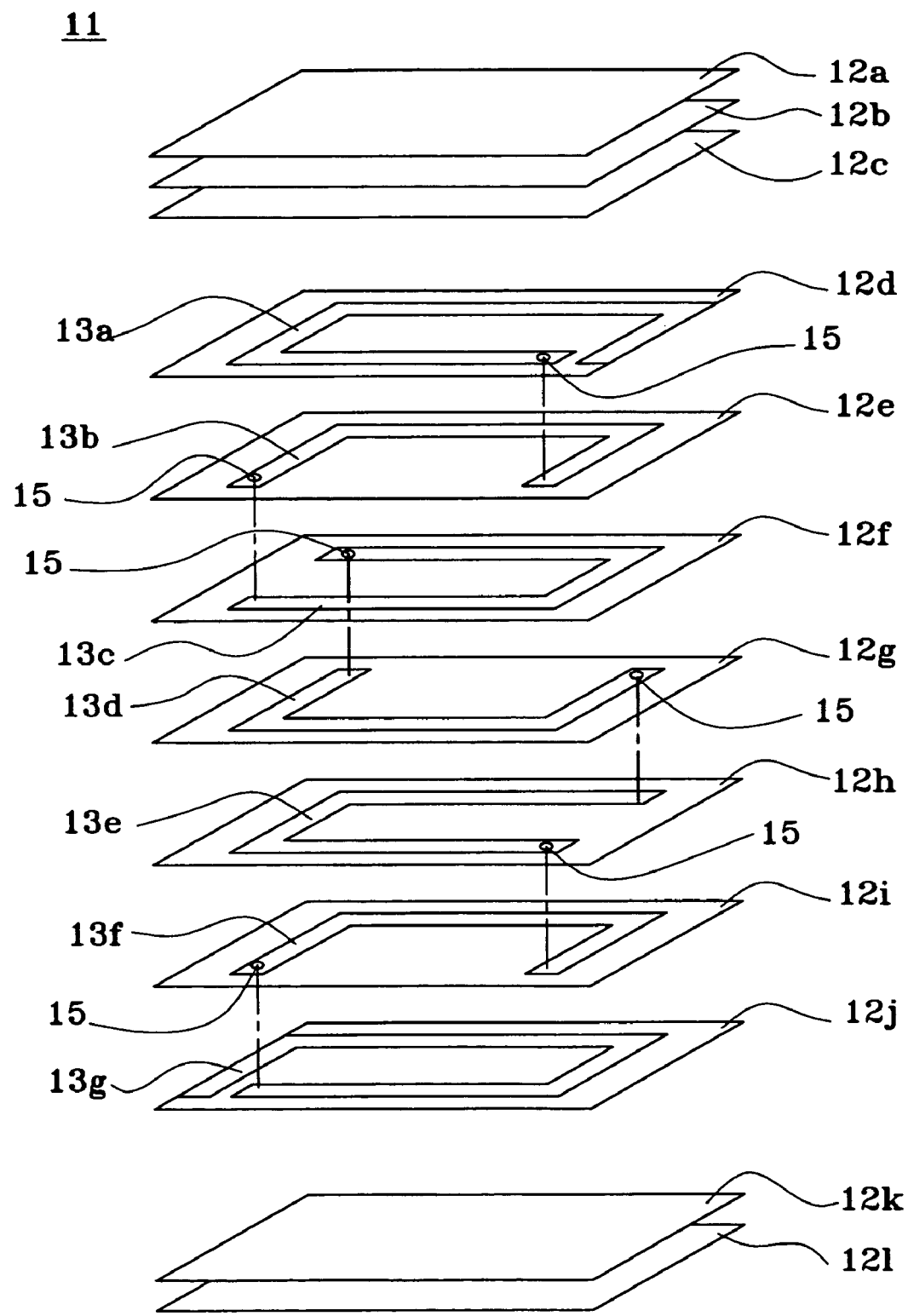
FIG. 3 is an exploded perspective view showing the structure of a ceramic electronic component of the present invention.

FIG. 2 is a perspective view of a multilayer inductor 11 that is an embodiment of a ceramic electronic component of the present invention. FIG. 3 is an exploded perspective view showing the structure of the multilayer inductor 11.

The multilayer inductor 11 includes a ceramic body 12 formed by laminating a plurality of ceramic layers 12a to 12l, inner conductors 13a to 13g disposed inside the ceramic body 12, and outer electrodes 14a and 14b disposed on the surface of the ceramic body 12. The outer electrodes 14a and 14b are electrically connected to the inner conductors 13a to 13g.

The ceramic body 12 is composed of a porcelain composition of the present invention. The inner conductors 13a to 13g are electrically connected to each other in series to form a spiral coil. The outer electrodes 14a and 14b are disposed on the surface of the ceramic body 12 such that the outer electrode 14a is connected to one end of the coil formed by the inner conductors 13a to 13g and the outer electrode 14b is connected to another end of the coil.

A method for producing the multilayer inductor 11 will now be described with reference to FIG. 3. The same starting materials as those in Example 1 were prepared. Subsequently, as in Example 1, the powders were weighed and mixed so as to obtain a porcelain composition having the composition ratio of Sample 8 in Table 1, a slurry was prepared, and green sheets 12a to 12l were then prepared.

Through-holes were provided in the green sheets 12d to 12i in the thickness direction. A conductive paste mainly composed of copper (Cu) was filled in the through-holes to form via holes 15. In addition, inner conductors 13a to 13g were formed on the surfaces of the green sheets 12d to 12j by screen printing. The inner conductors 13a to 13g were electrically connected with the via holes 15 to form a spiral coil as a whole.

Subsequently, the green sheets 12a to 12l were laminated and pressed in the thickness direction to prepare a laminated product. A paste mainly composed of Cu was applied on both ends of the laminated product. The resultant laminated product was fired at 980° C. in a non-oxidizing atmosphere containing nitrogen and hydrogen. Thus, the ceramic body 12 was prepared. The outer electrodes 14a and 14b were formed at both ends of the ceramic body 12.

The resultant ceramic body 12 can be immersed in plating solutions to form plating films on the outer electrodes. A first plating film composed of nickel (not shown in the figure) can be formed on the surfaces of the outer electrodes 14a and 14b by electrolytic plating. A second plating film composed of tin (not shown in the figure) can be formed on the first plating film. Thus, a multilayer inductor 11 with plated films is produced.

In this example, the ceramic body 12 was composed of laminated sheets.

Alternatively, the ceramic body 12 may be formed by, for example, printing or transfer printing. The inner conductors 13a to 13g may be formed by, for example, transfer printing. The filling of the conductive paste in the through-holes of the green sheets 12d to 12i and the formation of the inner conductors 13a to 13g may be performed at the same time. The outer electrodes 14a and 14b may be formed by, for example, baking after the firing step.

The ceramic electronic component of the present invention is not limited to a multilayer inductor as shown in the above example. For example the ceramic electronic component of the present invention may be a coil electronic component formed by injection molding, a capacitor, an LC composite component, or the like.

According to the multilayer inductor 11 in this example, the deterioration of the characteristics and the reliability can be suppressed since the porcelain composition of the present invention is used, thereby improving the yield in production. In addition, a paste mainly composed of Cu is used as the inner conductors 13a to 13g and the outer electrodes 14a and 14b. The use of such paste can prevent loss of the inner conductors 13a to 13g or the outer electrodes 14a and 14b due to their melting or volatilization during the firing step. Furthermore, the use of such paste can provide the interface between the inner conductors 13a to 13g and the outer electrodes 14a and 14b with a satisfactorily bonding property.

What is claimed is:

1. An oxide porcelain composition comprising:
   100 parts by weight of an oxide porcelain composition serving as a main component; and
   about 3 parts by weight or less of at least one oxide serving as an additional component selected from CaO, MgO, ZnO, and SrO;
   wherein the oxide porcelain composition comprises
   about 11.5 weight percent to 60.0 weight percent of Al, in the form of $Al_2O_3$;
   about 4.0 weight percent to 70.0 weight percent of Si, in the form of $SiO_2$;
   about 4.0 weight percent to 40.0 weight percent of Ba, in the form of BaO;
   about 1.0 weight percent to 30.0 weight percent of B, in the form of $B_2O_3$; and
   about 0.3 weight percent to 3.0 weight percent of Cr, in the form of $Cr_2O_3$.

2. An oxide porcelain composition according to claim 1, containing only one of said additional component oxides.

3. An oxide porcelain composition according to claim 1, containing two of said additional component oxides.

4. An oxide porcelain composition according to claim 1, containing three of said additional component oxides.

5. An oxide porcelain composition according to claim 1, containing all four of said additional component oxides.

6. An oxide porcelain composition according to claim 1, wherein said oxide porcelain composition comprises
   about 12–55 weight percent of Al, in the form of $Al_2O_3$;
   about 8–62 weight percent of Si, in the form of $SiO_2$;
   about 5–38 weight percent of Ba, in the form of BaO;
   about 3–20 weight percent to 30.0 weight percent of B, in the form of $B_2O_3$; and
   about 1–2 weight percent of Cr, in the form of $Cr_2O_3$.

7. An oxide porcelain composition according to claim 2, wherein said oxide porcelain composition comprises
   about 12–55 weight percent of Al, in the form of $Al_2O_3$;
   about 8–62 weight percent of Si, in the form of $SiO_2$;
   about 5–38 weight percent of Ba, in the form of BaO;

about 3–20 weight percent to 30.0 weight percent of B, in the form of $B_2O_3$; and about 1–2 weight percent of Cr, in the form of $Cr_2O_3$.

8. A ceramic multilayer substrate comprising:
a ceramic laminated body including ceramic layers; and
inner conductors disposed between ceramic layers,
wherein the ceramic layers comprise the oxide porcelain composition according to claim 7.

9. A ceramic multilayer substrate comprising:
a ceramic laminated body including ceramic layers; and
inner conductors disposed between ceramic layers,
wherein the ceramic layers comprise the oxide porcelain composition according to claim 6.

10. A ceramic multilayer substrate comprising:
a ceramic laminated body including ceramic layers; and
inner conductors disposed between the ceramic layers,
wherein the ceramic layers comprise oxide porcelain composition according to claim 1.

11. The ceramic electronic component according to claim 10, wherein the inner conductors and having outer electrodes which comprise copper.

12. A ceramic multilayer substrate comprising:
a ceramic laminated body including ceramic layers; and
inner conductors disposed between ceramic layers,
wherein the ceramic layers comprise the oxide porcelain composition according to claim 2.

13. The ceramic electronic component according to claim 12, wherein the inner conductors and having outer electrodes which comprise copper.

14. A ceramic electronic component comprising:
a ceramic body;
inner conductors disposed inside the ceramic body; and
outer electrodes disposed on the surface of the ceramic body,
wherein the ceramic body comprises the oxide porcelain composition according to claim 2.

15. The ceramic electronic component according to claim 14, wherein the inner conductors and the outer electrodes comprise copper.

16. A ceramic electronic component comprising:
a ceramic body;
inner conductors disposed inside the ceramic body; and
outer electrodes disposed on the surface of the ceramic body,
wherein the ceramic body comprises the oxide porcelain composition according to claim 1.

17. The ceramic electronic component according to claim 16, wherein the inner conductors and the outer electrodes comprise copper.

18. A ceramic electronic component comprising:
a ceramic body;
inner conductors disposed inside the ceramic body; and
outer electrodes disposed on the surface of the ceramic body,
wherein the ceramic body comprises the oxide porcelain composition according to claim 6.

19. A ceramic electronic component comprising:
a ceramic body;
inner conductors disposed inside the ceramic body; and
outer electrodes disposed on the surface of the ceramic body,
wherein the ceramic body comprises the oxide porcelain composition according to claim 1 which contains more than one of said additional component oxides.

* * * * *